United States Patent
Kawamichi et al.

(10) Patent No.: US 7,441,221 B2
(45) Date of Patent: Oct. 21, 2008

(54) METHOD AND APPARATUS FOR GENERATING DESIGN INFORMATION, AND COMPUTER PRODUCT

(75) Inventors: Taketsugu Kawamichi, Kawasaki (JP); Hiroshi Nakamura, Kawasaki (JP); Eiichi Konno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 432 days.

(21) Appl. No.: 11/251,770

(22) Filed: Oct. 18, 2005

(65) Prior Publication Data
US 2007/0028202 A1    Feb. 1, 2007

(30) Foreign Application Priority Data
Jul. 27, 2005   (JP)   ............... 2005-217489

(51) Int. Cl.
G06F 17/50   (2006.01)
(52) U.S. Cl. ...................................... 716/15
(58) Field of Classification Search ............. 716/10–15
See application file for complete search history.

(56) References Cited

U.S. PATENT DOCUMENTS 6,440,542 B1 * 8/2002 Kariya ...................... 428/209
6,886,151 B2   4/2005 Tanaka
2002/0174413 A1 * 11/2002 Tanaka ......................... 716/13
2004/0104042 A1 * 6/2004 Takase et al. ................ 174/255
2004/0176938 A1 * 9/2004 Gisin et al. ..................... 703/14
2005/0077083 A1 * 4/2005 Mattix ......................... 174/265

FOREIGN PATENT DOCUMENTS

JP   3-231371   10/1991
JP   2002-342398   11/2002

OTHER PUBLICATIONS

Kinji Ito, "Prinited Wiring Technical Reader", p. 193, $2^{ND}$ Edition, Published by the Nikkan Kogyo Shimbun Co., Ltd, May 1989.

* cited by examiner

*Primary Examiner*—Paul Dinh
(74) *Attorney, Agent, or Firm*—Staas & Halsey LLP

(57) ABSTRACT

An apparatus generates design information on a via hole that passes through predetermined layers of a multilayer wiring board, by storing information on at least one of a shape and a size of a land to be provided around the via hole. When designing a via hole that passes through a plurality of internal layers of the wiring board, the land information for an internal layer is applied to each internal layer through which the via hole passes.

9 Claims, 13 Drawing Sheets

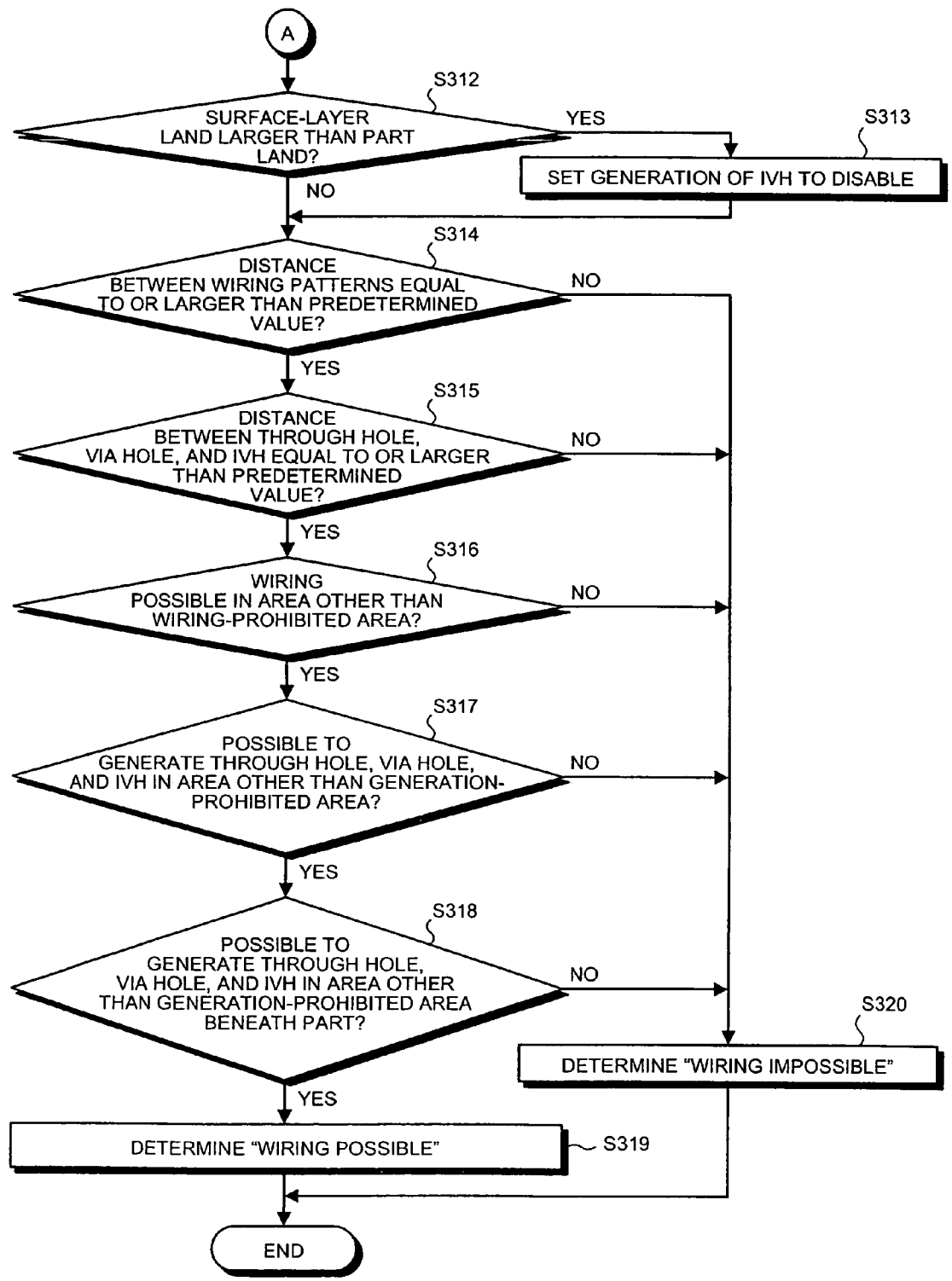

METHOD AND APPARATUS FOR GENERATING DESIGN INFORMATION, AND COMPUTER PRODUCT

BACKGROUND OF THE INVENTION

1. Field of the Invention

The present invention relates to a technology for generating design information on via holes that pass through predetermined layers of a multilayer wiring board.

2. Description of the Related Art

Recently, information terminals such as cell phones are equipped with increasingly high-grade functions, requiring an even higher density of a printed wiring board mounted on the information terminals. To meet this requirement, a multilayer technique for providing a multilayer printed-wiring-board is currently in use.

According to the multilayer technique, via holes are formed on a printed wiring board, and a conductive substance is filled in the via holes to electrically connect the layers. Some via holes connect all of the layers, and others connect specific layers. Particularly, the latter via holes are called interstitial via holes (IVHs).

When the printed wiring board has a high density, it becomes difficult to manually design the wiring patterns. Therefore, a computer-aided design (CAD) system for assisting the design of the printed wiring board is widely used.

In a CAD system, information on elements that is repetitively used to design a printed wiring board is stored in advance in a computer as a library file. The library file is suitably read out to design the printed wiring board, as described in, for example, Kinji ITOH, "Printed wiring board techniques", second edition, p.193, published by Nikkan Kogyo Shimbun, May 1989.

Specifically, at the time of designing the IVHs, information about a combination of layers on which the IVHs are formed is employed. For example, when designing the IVHs that pass through a second layer to a fifth layer in a eight-layer printed wiring board, a user assigns a land having a predetermined shape and a predetermined size to be provided around the IVHs on each of the second layer, the third layer, the fourth layer, and the fifth layer. The user registers the assigned information as a land type in advance. When the user assigns the land type on a design screen of the printed wiring board, the CAD system generates information on designing the IVHs from the second layer to the fifth layer.

FIG. 11 is a schematic for illustrating an example of a design screen for a printed wiring board, according to a conventional technology. This design screen includes a wiring-data display area, a process selection area, a land-type input area, and a message display area.

The wiring-data display area displays a layout of parts on the printed wiring board, a wiring pattern, a land, interstitial via holes, and a wiring-prohibited area. The process selection area receives a selection of a process carried out at the time of designing the printed wiring board, with an operation of an input unit such as a mouse.

The land-type input area receives a selection of a land type with the operation of the input unit. The message display area displays various kinds of messages such as an error message.

The land-type input area displays an identification number for identifying a land type. The identification number is typically a three-digit number. The first and the second digits represent a range of layers to which the IVHs are connected, that is, a range of layers on which a land is formed, and the third digit represents an element number.

For example, when the identification number is "924", the third digit "9" shows that the element is a land having a predetermined shape and a predetermined size. The second and the first digits "24" show that the IVHs connect layers from the second layer to the fourth layer and that a land is formed on the second layer to the fourth layer.

Another type of CAD system makes the user input a land type in a table format. FIG. 12 is a schematic for illustrating an example of a design screen that receives inputs of a land type in a table format. In this case, the land type is determined by selecting circles corresponding to "layer L2" and "layer L4" with the operation of the input unit.

When the user selects a land type, the land type corresponding to the "layer L2" and the "layer L4" is selected from land types registered in advance by the user. Then, the IVHs are designed based on information on the selected land type.

However, in the conventional technology it is necessary to predefine a land type to be used for each combination of layers of a printed wiring board for which design information on via holes such as the IVHs is generated, which requires considerable time and effort from the user.

When the number of layers is small, the number of land types to be used is not too large, so that the problem is not so severe. However, when a printed wiring board has considerable number of layers because of high density of the printed wiring board, a large number of land types are necessary, which makes it difficult to handle the land types.

Therefore, it is very important to design via holes by efficiently managing information on lands, without making a user take care of layers of a printed wiring board through which the via holes pass.

SUMMARY OF THE INVENTION

It is an object of the present invention to at least solve the problems in the conventional technology.

A computer-readable recording medium according to one aspect of the present invention stores therein a computer program for generating design information on a via hole that passes through predetermined layers of a multilayer wiring board. The computer program causes a computer to execute storing information on at least one of a shape and a size of a land to be provided around the via hole; and generating the design information, when designing a via hole that passes through a plurality of internal layers of the wiring board, by applying the information on one kind of land for an internal layer to each of the internal layers through which the via hole passes.

An apparatus according to another aspect of the present invention, which is for generating design information on a via hole that passes through predetermined layers of a multilayer wiring board, includes a storing unit that stores information on at least one of a shape and a size of a land to be provided around the via hole; and a design-information generating unit that generates the design information, when designing a via hole that passes through a plurality of internal layers of the wiring board, by applying the information on one kind of land for an internal layer to each of the internal layers through which the via hole passes.

A method according to still another aspect of the present invention, which is for generating design information on a via hole that passes through predetermined layers of a multilayer wiring board, includes storing information on at least one of a shape and a size of a land to be provided around the via hole; and generating the design information, when designing a via hole that passes through a plurality of internal layers of the wiring board, by applying the information on one kind of land for an internal layer to each of the internal-layers through which the via hole passes.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 9A and 9B are flowcharts of a processing procedure for a wiring-possibility determination process;

DETAILED DESCRIPTION OF THE PREFERRED EMBODIMENTS

Exemplary embodiments of the present invention will be explained below in detail with reference to the accompanying drawings.

Figure 1:
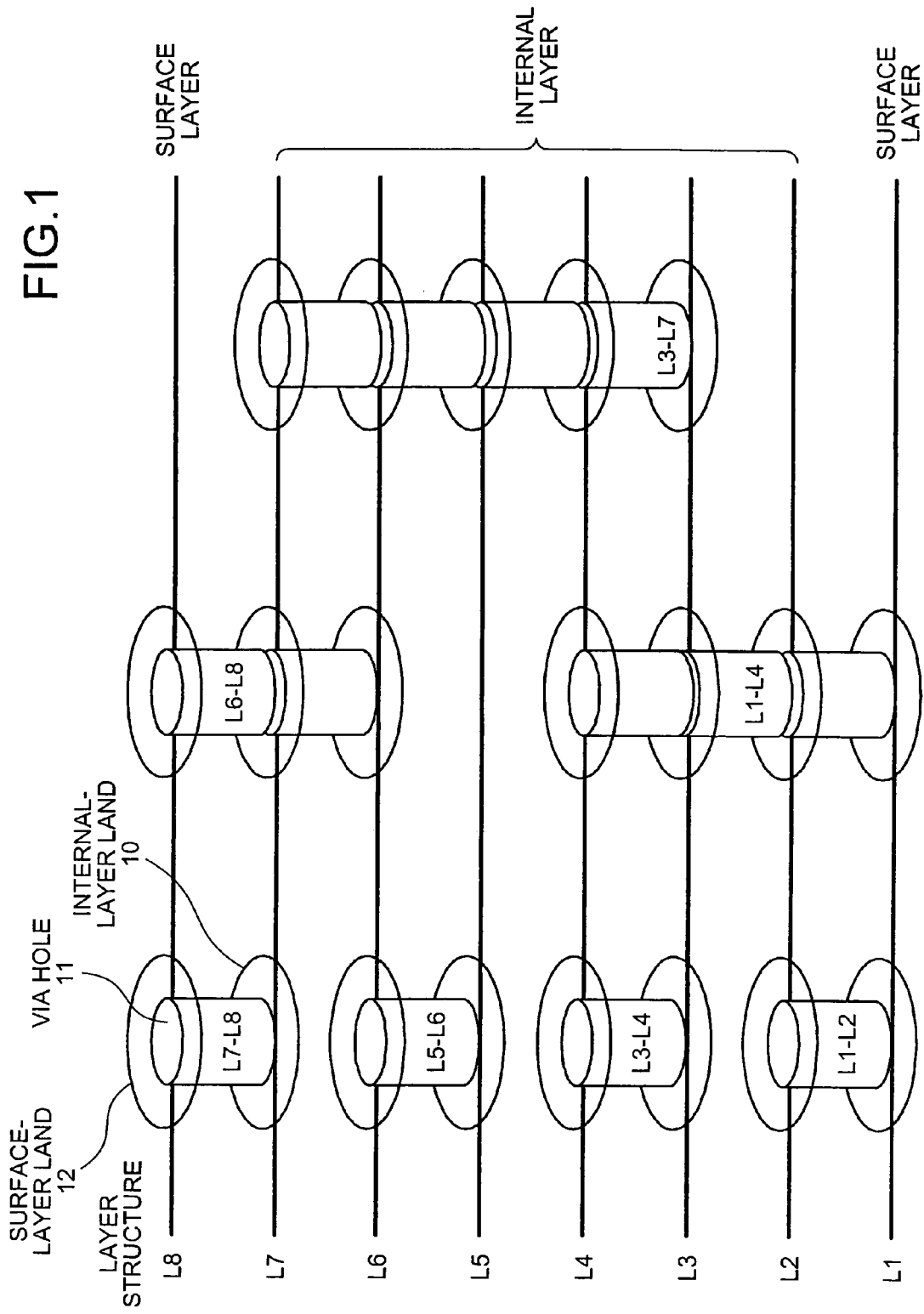
FIG. 1 is a schematic for illustrating a concept of a design-information generation process according to the present invention.

FIG. 1 is a schematic for illustrating a concept of a design-information generation process according to the present invention. In the example shown in FIG. 1, a printed wiring board has eight layers from L1 to L8; however, the number of layers is not limited to eight.

According to the present invention, design information on via holes 11 that connect the internal layers L2 to L7 of the multilayer printed wiring board is generated using only one kind of an internal-layer land 10 having a predetermined shape and a predetermined size.

Information on the shape and the size of the internal-layer land 10 to be provided on the printed wiring board is prepared and stored in advance. The information on the shape and the size is applied to each layer of L2 to L7 through which the via holes pass, thereby generating the design information including the shape and the size of the via holes 11.

Accordingly, it is not necessary to register many land types in advance. The land information can be managed efficiently, and it is possible to design via holes easily without making the user take care of each of the layer of the printed wiring board through which a via hole passes.

A surface-layer land 12 to be formed on the surface layer is made smaller than the internal-layer land 10. By making the surface-layer land 12 as small as possible, the surface layer has high wiring density.

Figure 2:
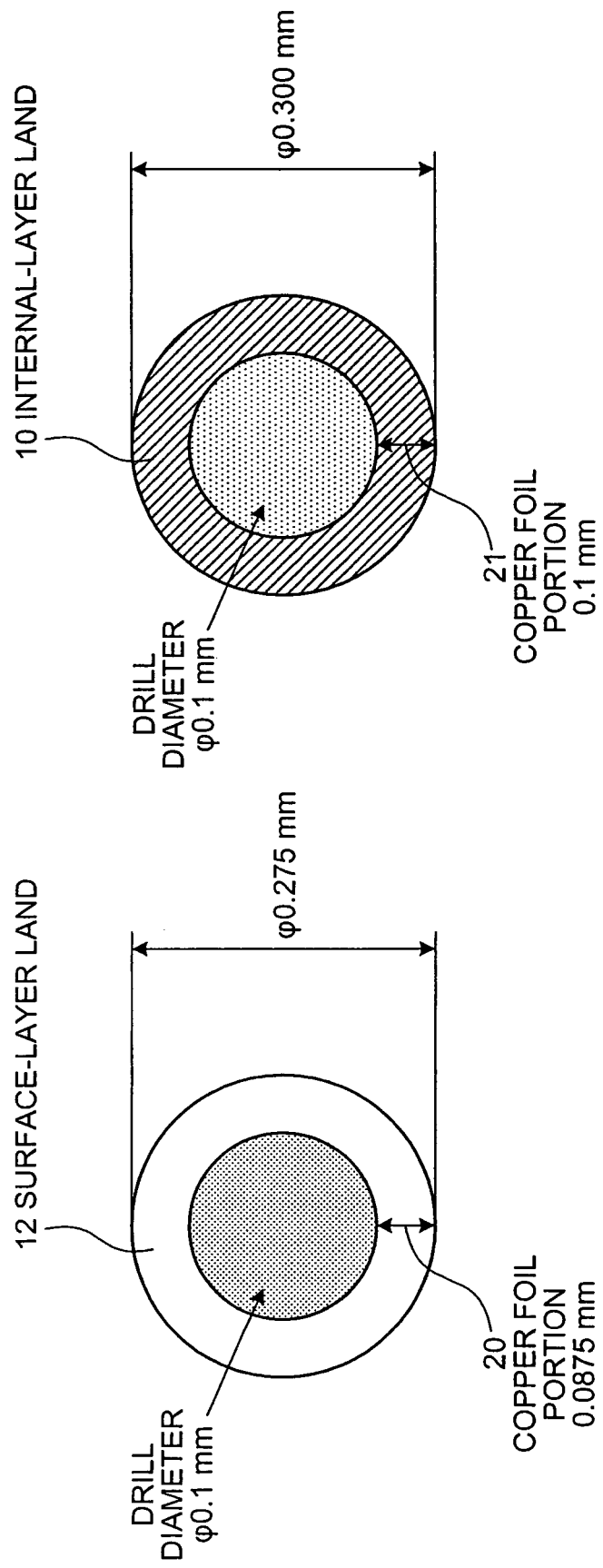
FIG. 2 is a schematic for illustrating shapes and sizes of a surface-layer land and an internal-layer land.

FIG. 2 is a schematic for illustrating shapes and sizes of the surface-layer land 12 and the internal-layer land 10. In this example, both the surface-layer land 12 and the internal-layer land 10 have circular shapes. The surface-layer land 12 has a diameter of 0.275 millimeter, and a drill diameter of 0.1 millimeter. Therefore, a copper foil portion 20 of the surface-layer land 12 has a width of 0.0875 millimeter ((0.275−0.1)/2=0.0875).

On the other hand, the internal-layer land 10 has a diameter of 0.3 millimeter, and a drill diameter of 0.1 millimeter. Therefore, a copper foil portion 21 of the internal-layer land 10 has a width of 0.1 millimeter ((0.3−0.1)/2=0.1).

Figure 3:
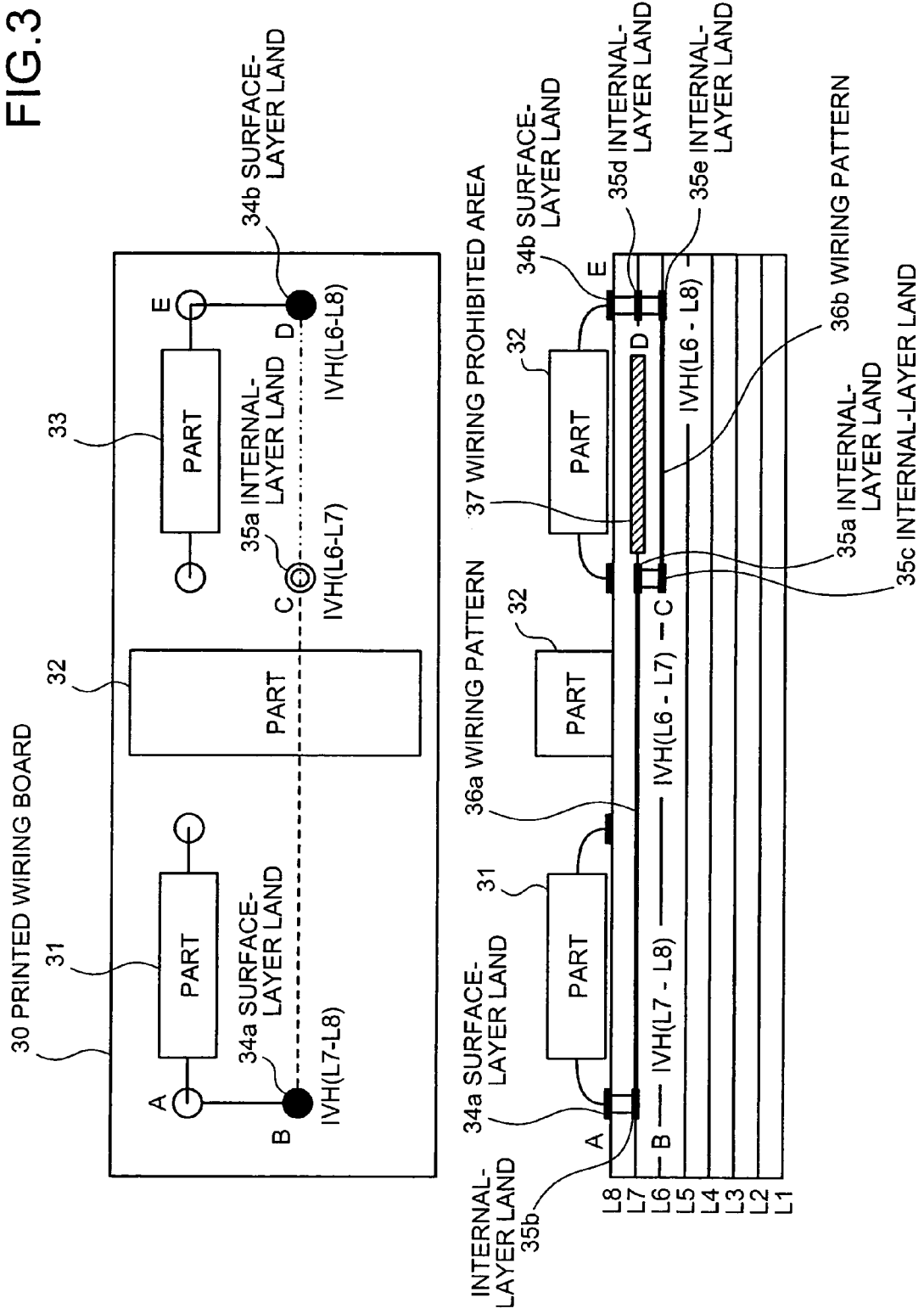
FIG. 3 is a schematic for illustrating an example of the design-information generation process.

FIG. 3 is a schematic for illustrating an example of the design-information generation process using the internal-layer land 10 and the surface-layer land 12 shown in FIG. 2. In this case, the surface layer L8 of the printed wiring board 30 has three parts 31, 32, and 33.

It is difficult to wire between the part 31 and the part 33 on the surface layer L8, because the part 32 is present on this surface. Therefore, in the design-information generation process, wiring is carried out via the internal layers L7 and L6.

Specifically, a wiring pattern for connecting a position A and a position B, and a wiring pattern for connecting a position D and a position E are generated on the surface layer L8. At the position B, a surface-layer land 34a and an internal-layer land 35b are generated, and an IVH that passes through the surface layer L8 and the internal layer L7 is generated based on the information on the shapes and the sizes of the surface-layer land 34a and the internal-layer land 35b.

When a wiring-prohibited area 37, on which a generation of a wiring pattern between the position C and the position D is prohibited, is present on the internal layer L7, the wiring pattern is generated in the internal layer L6 at the position C. Therefore, an internal-layer land 35a and an internal-layer land 35c having the same shape and the same size as those of the internal-layer land 35b are generated.

Furthermore, an IVH that passes through the internal layer L7 and the internal layer L6 is generated based on the information on the shapes and the sizes of the internal-layer land 35a and the internal-layer land 35c. A wiring pattern 36a that connects the internal-layer land 35b and the internal-layer land 35a is generated.

At the position D, a surface-layer land 34b having the same shape and the same size as those of the surface-layer land 34b is generated. Furthermore, an internal-layer land 35d and an internal-layer land 35e having the same shape and the same size as those of the internal-layer land 35b, respectively, are generated.

An IVH that passes through the internal layer L6, the internal layer L7, and the surface layer L8 is generated based on the information on the shapes and the sizes of the surface-layer land 34b, the internal-layer land 35d, and the internal-layer land 35e, respectively. Furthermore, a wiring pattern 36b that connects the internal-layer land 35e and the internal-layer land 35c is generated.

Figure 4:
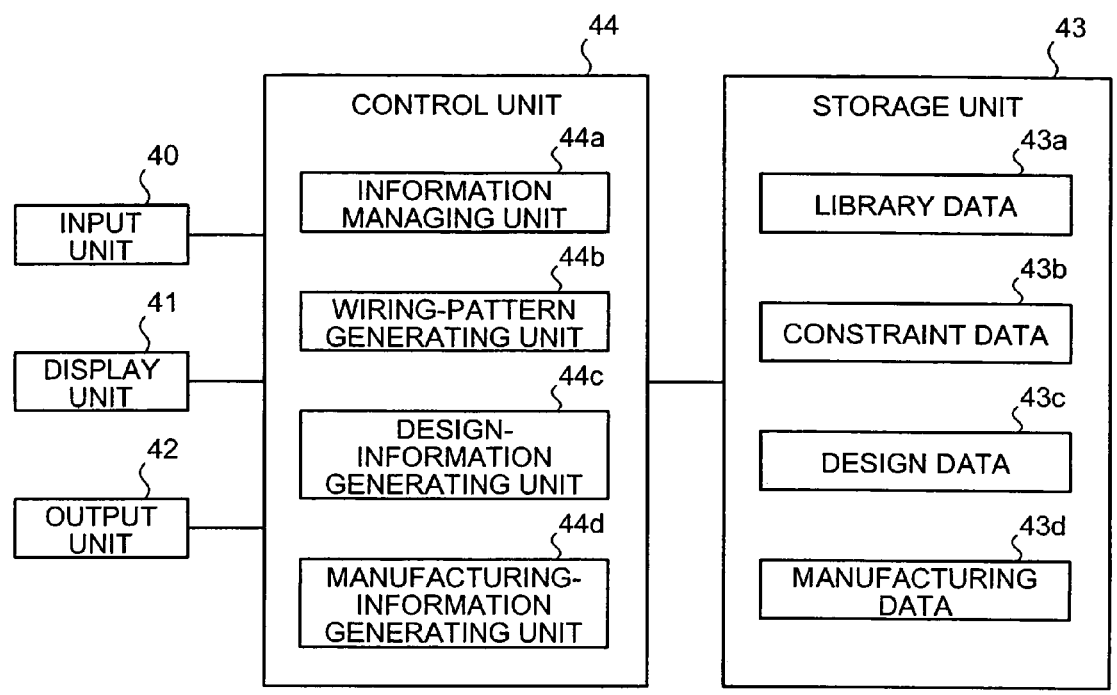
FIG. 4 is a block diagram of a CAD device according an embodiment of the present invention.

FIG. 4 is a block diagram of a CAD device according an embodiment of the present invention. The CAD device includes an input unit 40, a display unit 41, an output unit 42, a storing unit 43, and a control unit 44.

The input unit 40 includes a keyboard, a mouse, a stylus pen, a tablet, or the like. The display unit 41 includes a monitor or the like. The output unit 42 outputs information to a printer or a storage unit that stores information in a predetermined storage medium. The predetermined storage medium includes a magnetic tape, a compact disk read-only memory (CD-ROM), a digital versatile disk (DVD), a magneto-optic disk, or the like.

The storing unit 43 is a storage device such as an internal hard disk, an external hard disk, a compact disk-recordable (CD-R) drive, and a magneto-optical (MO) disk drive. The storing unit 43 stores library data 43a, constraint data 43b, design data 43c, and manufacturing data 43d.

The library data 43a includes information on a shape and a size of each part mounted on a printed wiring board, a shape and a size of a land, or the like.

The constraint data 43b includes various kinds of constraints concerning wiring. Specifically, the constraint data 43b includes a necessary distance between wiring patterns, a necessary distance between a wiring pattern and a wide area pattern to the whole surface of which a copper foil or the like is adhered, a wiring-prohibited area, and a generation prohibited area of a through hole, a via hole, and an IVH on each layer of the printed wiring board, and a generation prohibited area of a through hole, a via hole, and an IVH at a lower surface of the parts.

The design data 43c includes positions, shapes, and sizes of a wiring pattern, a part, a through hole, an IVH, a land or the like that are generated on the printed wiring board.

The manufacturing data includes information on drill diameters of a through hole, a via hole, and an IVH. The manufacturing data 43d is referenced at the time of actually forming holes by laser beam on each layer of a printed wiring board on which a through hole, a via hole, and an IVH are designed.

The manufacturing data 43d is generated from the design data 43c, and includes drill diameters of a through hole, a via hole, and an IVH that pass through each layer of a printed wiring board, as described above.

For example, drill diameters of the surface-layer lands 34a and 34b are stored corresponding to the surface layer L8 shown in FIG. 3, drill diameters of the internal-layer lands 35a, 35b, and 35d are stored corresponding to the internal layer L7, and drill diameters of the internal-layer lands 35c and 35e are stored corresponding to the internal layer L6.

The control unit 44 controls the entire CAD device, and exchanges data between functional units. The control unit 44 includes an information managing unit 44a, a wiring-pattern generating unit 44b, a design-information generating unit 44c, and a manufacturing-information generating unit 44d.

The information managing unit 44a manages various pieces of information on the design-information generation process. Specifically, when the information managing unit 44a receives information on shapes and sizes of parts and lands from the input unit 40, the information managing unit 44a stores the received information as the library data 43a in the storing unit 43.

When the information managing unit 44a receives information of constraints on wiring from the input unit 40, the information managing unit 44a stores the information as the constraint data 43b in the storing unit 43.

The information managing unit 44a reads the design data 43c and the manufacturing data 43d stored in the storing unit 43, and delivers the read data to the display unit 41 or the output unit 42.

For example, when design information on a wiring pattern, a via hole, and a land is generated, the information managing unit 44a displays this information in the display unit 41 and outputs the information to the output unit 42. Particularly, at the time of displaying or outputting the design information on a via hole, the information managing unit 44a outputs identification information to identify whether the via hole is an IVH.

Specifically, when a via hole is an IVH, the information managing unit 44a can display and output that the via hole is a VIH using a combination of layers as shown in FIG. 1. For example, an IVH is expressed as L7-L8, and a via hole that passes through all the layers is expressed as L1-L8. Therefore, the IVHs can be easily identified.

When a via hole is an IVH and also when the via hole is registered as an IVH as attribute information on a land provided around the via hole, the information managing unit 44a can display and output this attribute information. Alternatively, the information managing unit 44a can display and output via hole information indicating that the via hole is an IVH, according to other methods.

The wiring-pattern generating unit 44b generates a wiring pattern that can connect two points on a printed wiring board. While the wiring pattern can be generated automatically, the wiring pattern can be also generated manually. Alternatively, only a part of the wiring pattern can be generated manually.

At the time of manually generating a wiring pattern, the wiring-pattern generating unit 44b receives information about a position of a wiring pattern and a layer in which the wiring pattern is to be generated that is input by the user, and generates the wiring pattern based on this input information. After generating the wiring pattern, the wiring-pattern generating unit 44b stores the wiring pattern in the storing unit 43 as the design data 43c.

The wiring-pattern generating unit 44b reads the constraint data 43b stored in the storing unit 43, and generates only a wiring pattern that satisfies the constraints stored as the constraint data 43b.

The design-information generating unit 44c generates design information on via holes and lands that are formed around the via holes, when the via holes need to be generated in the wiring pattern generated by the wiring-pattern generating unit 44b.

When design information on via holes and lands is to be generated on an internal layer of a printed wiring board, the design-information generating unit 44c generates the design information by combining the lands using only one kind of land having a predetermined shape and a predetermined size.

When design information on via holes and lands is to be generated on a surface layer, the design-information generating unit 44c generates the design information using a size of the surface-layer land that is different from the size of the internal-layer land as explained with reference to FIG. 2.

When design information indicates that a generated via hole is an IVH that does not pass through all layers of a printed wiring board, the design-information generating unit 44c generates information indicating that the via hole is an IVH, and stores this information in the storing unit 43 as the design data 43c.

To generate design information on a via hole and a land, the design-information generating unit 44c reads the constraint data 43b stored in the storing unit 43, and generates only design information on a via hole and a land that satisfies the constraints.

Figure 5:
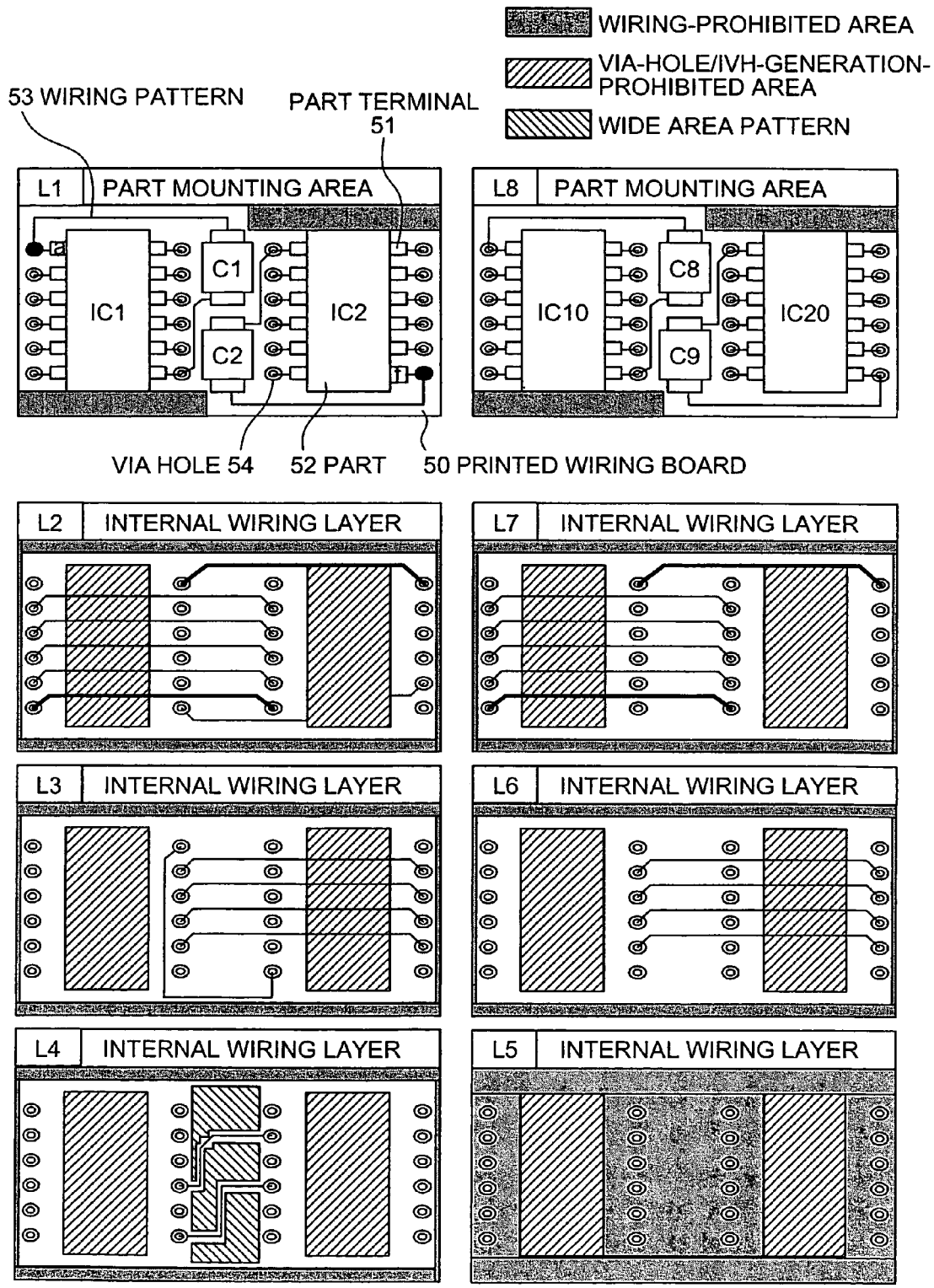
FIG. 5 is a schematic for illustrating constraints on a wiring.

FIG. 5 is a schematic for illustrating constraints on a wiring. In the example shown in FIG. 5, a part 52 (IC1, IC2, C1, C2, IC10, IC20, C8, and C9) having a part terminal 51 is disposed on part mounting layers L1 and L8 as surface layers of a printed wiring board 50, respectively. A wiring pattern 53 and via holes 54 are disposed on the part mounting layers L1 and L8 and the internal wiring layers L2 to L7.

Assuming that a part terminal "a" of the part IC1 is to be connected to a part terminal f of the part IC2, on the part mounting layer L1, existing wiring patterns are congested, a necessary distance cannot be secured between the wiring patterns, and wiring-prohibited areas are present. Therefore, the wiring-pattern generating unit 44b determines that the wiring cannot be achieved on the surface layer L1.

On the internal wiring layer L2, existing wiring patterns are congested, a necessary distance cannot be secured between the wiring patterns, and wiring-prohibited areas are present. Therefore, the wiring-pattern generating unit 44b determines that the wiring cannot be achieved on the internal wiring layer L2. On the internal wiring layer L2, generation prohibited areas of a via hole and an IVH are also present. Therefore, the design-information generating unit 44c determines that a via hole and an IVH cannot be generated in these generation prohibited areas.

On the internal wiring layer L3, existing wiring patterns are congested, a necessary distance cannot be secured between the wiring patterns, and wiring-prohibited areas are present. Therefore, the wiring-pattern generating unit 44b determines that the wiring cannot be achieved on the internal wiring layer L3. On the internal wiring layer L2, generation prohibited areas of a via hole and an IVH are also present. Therefore, the design-information generating unit 44c determines that a via hole and an IVH cannot be generated in these generation prohibited areas.

On the internal wiring layer L4, existing wiring patterns are congested, a necessary distance cannot be secured between the wiring patterns, and wide area patterns are present between the part terminal "a" of the part IC1 and the part terminal f of the part IC2, thereby blocking off the routes. Furthermore, wiring-prohibited areas are present. Therefore, the wiring-pattern generating unit 44b determines that the wiring cannot be achieved on the internal wiring layer L4. On the internal wiring layer L4, generation prohibited areas of a via hole and an IVH are also present. Therefore, the design-information generating unit 44c determines that a via hole and an IVH cannot be generated in these generation prohibited areas.

On the internal wiring layer L5, a wiring-prohibited area is present. Therefore, the wiring-pattern generating unit 44b determines that the wiring cannot be achieved on the internal wiring layer L5. On the internal wiring layer L5, generation prohibited areas of a via hole and an IVH are also present. Therefore, the design-information generating unit 44c determines that a via hole and an IVH cannot be generated in these generation prohibited areas. Thereafter, determinations are made in a similar manner on the internal wiring layers L6 and L7 and the part mounting layer L8. In this case, it is determined that the wiring cannot be achieved.

However, even when it is determined that the wiring cannot be achieved, the wiring can be achieved by correcting a existing wiring pattern. The wiring-pattern generating unit 44b and the design-information generating unit 44c can correct the wiring pattern based on an assignment from the user. Alternatively, the wiring-pattern generating unit 44b and the design-information generating unit 44c can automatically correct the wiring pattern.

Figure 6:
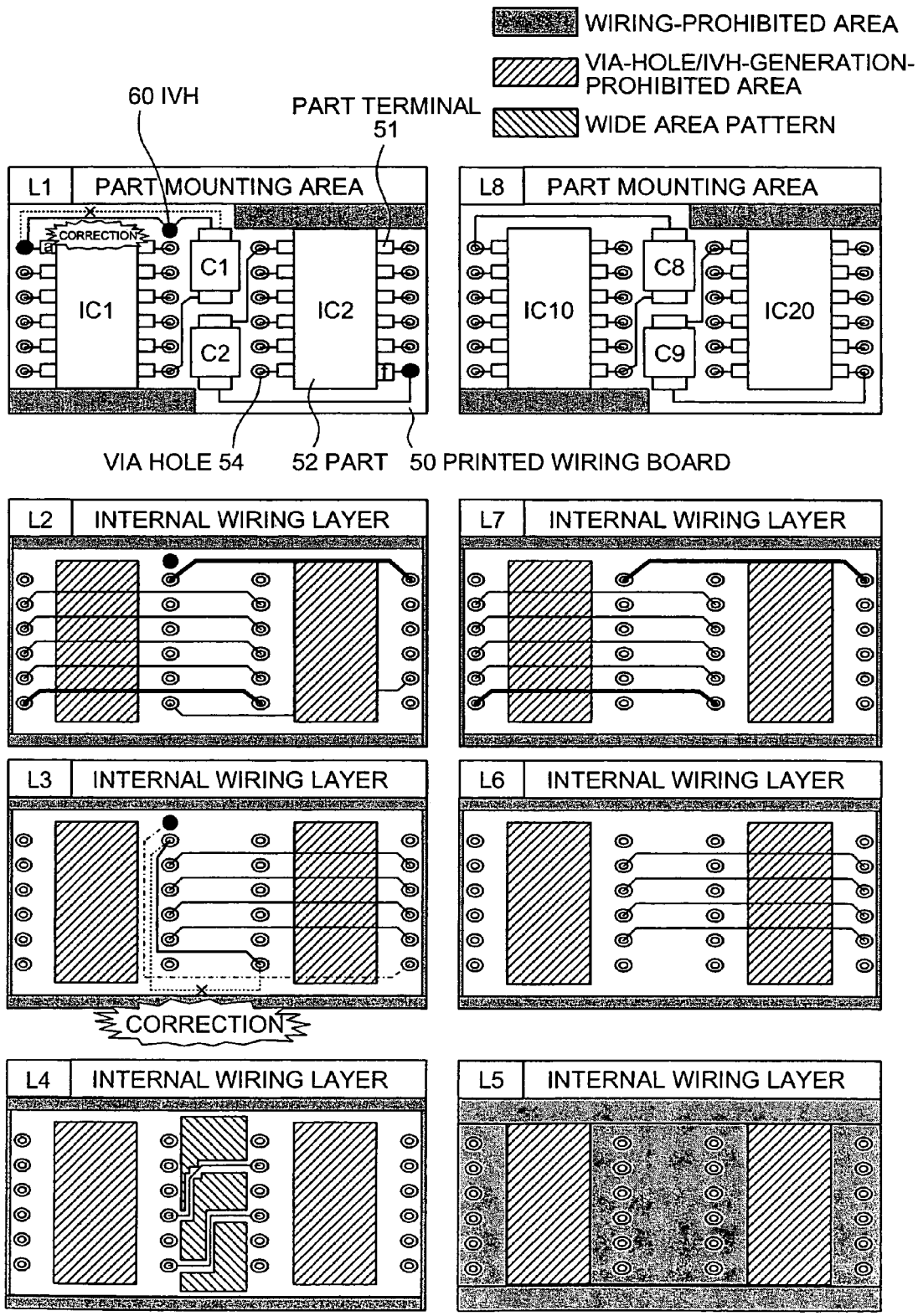
FIG. 6 is a schematic for illustrating a correction of a wiring pattern.

FIG. 6 is a schematic for illustrating a correction of a wiring pattern shown in FIG. 5. The design-information generating unit 44c determines whether there is an area in which an IVH can be generated in the part mounting layer L1, and the internal wiring layers L2 and L3.

Specifically, the design-information generating unit 44c determines whether a distance between a land provided around the via hole and a land provided around an IVH 60 is equal to or larger than a predetermined value. Furthermore, the design-information generating unit 44c determines whether a distance between a land connected to the part terminal and a land provided around the IVH 60 is equal to or larger than a predetermined value. Furthermore, the design-information generating unit 44c determines whether the land provided around the IVH 60 is not included in the generation prohibited area of a via hole and an IVH.

When these constraints are all satisfied, the design-information generating unit 44c generates the IVH 60 in the part mounting layer L1, and the internal wiring layers L2 and L3. However, because it is not preferable that the wiring pattern is branched in a T shape, the wiring-pattern generating unit 44b corrects the existing wiring pattern (a dotted line) to a new wiring pattern (a solid line) on the part mounting layer L1.

To wire between the land generated on the internal wiring layer L3 and the via hole connected to the part terminal f, the wiring-pattern generating unit 44b corrects the existing wiring pattern (a dotted line) to a new wiring pattern (a solid line) on the internal wiring layer L3.

Specifically, the wiring-pattern generating unit 44b determines whether a distance between the new wiring pattern and the existing wiring pattern is equal to or larger than a predetermined value. The wiring-pattern generating unit 44b determines whether a distance between the new wiring pattern and the existing via hole or IVH is equal to or larger than a predetermined value. Furthermore, the wiring-pattern generating unit 44b determines whether the new wiring pattern is not included in the wiring-prohibited area.

When these constraints are all satisfied, the wiring-pattern generating unit 44b corrects the existing wiring pattern (a dotted line) to a new wiring pattern (a solid line).

Subsequently, the wiring-pattern generating unit 44b generates a wiring pattern (a dashed line) between the IVH 60 and the via hole connected to the part terminal f on the internal wiring layer L3. Specifically, the wiring-pattern generating unit 44b determines whether a distance between the new wiring pattern and the existing pattern is equal to or larger than a predetermined value.

The wiring-pattern generating unit 44b determines whether a distance between the new wiring pattern and the existing via hole or IVH is equal to or larger than a predetermined value. Furthermore, the wiring-pattern generating unit 44b determines whether the new wiring pattern is not included in the wiring-prohibited area.

When these constraints are all satisfied, the wiring-pattern generating unit 44b generates a wiring pattern (a dashed line) that connects the IVH 60 and the via hole connected to the part terminal f on the internal wiring layer L3.

With reference to FIG. 4 again, the manufacturing-information generating unit 44d generates manufacturing data including information on a drill diameter of a via hole based on the design data generated by the wiring-pattern generating unit 44b and the design-information generating unit 44c.

The manufacturing-information generating unit 44d generates information on a drill diameter of a via hole in each layer of the printed wiring board, and stores the generated information on the drill diameter in the storing unit 43 as the manufacturing data 43d.

Figure 7:
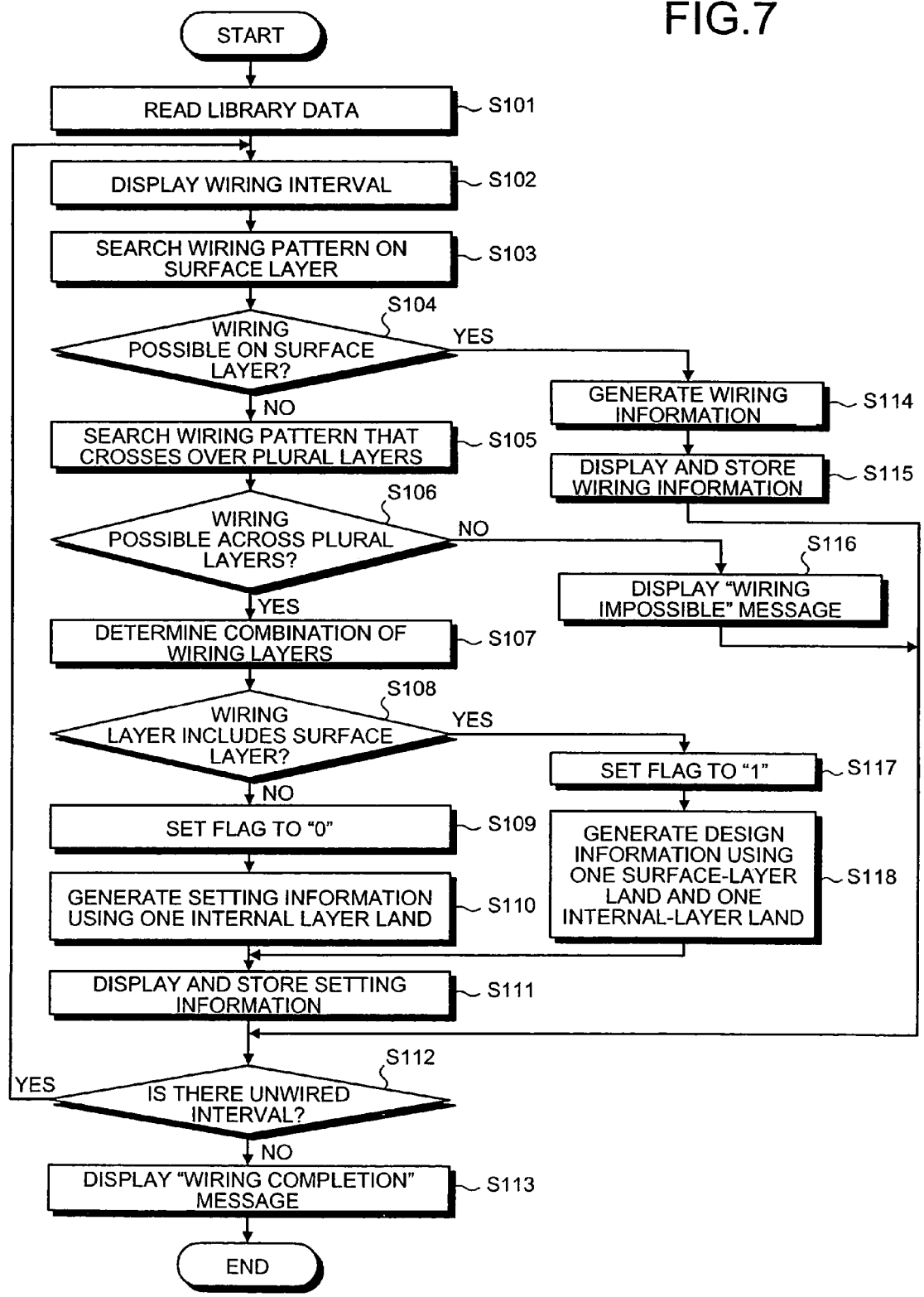
FIG. 7 is a flowchart of a processing procedure for a design-information generation process according to the present embodiment.

FIG. 7 is a flowchart of a processing procedure for a design-information generation process according to the present embodiment. The wiring-pattern generating unit 44b of the CAD device reads the library data 43a including a shape and a size of each part to be mounted on a printed wiring board and a shape and a size of a land to be formed on the printed wiring board, from the storing unit 43 (step S101), and displays a wiring section in the display unit 41 (step S102).

The wiring-pattern generating unit 44b and the design-information generating unit 44c search a wiring pattern that can be wired on the surface layer (step S103). Specifically, the wiring-pattern generating unit 44b reads the constraint data 43b stored in the storing unit 43, and searches a wiring pattern that satisfies the constraints.

The design-information generating unit 44c checks whether a through hole, a via hole, and a land that are necessary for the wiring pattern searched by the wiring-pattern generating unit 44b satisfy the constraints. When a wiring pattern that satisfies the constraints is present, the wiring-pattern generating unit 44b determines that a wiring can be achieved on the surface layer.

The wiring-pattern generating unit 44b checks whether the wiring can be achieved on the surface layer (step S104). When the wiring can be achieved (step S104: Yes), the wiring-pattern generating unit 44b generates wiring information including position of the wiring pattern (step S114), displays this information in the display unit 41, and stores this information in the storing unit 43 as the design data 43c (step S115).

The wiring-pattern generating unit 44b checks whether an unwired section is present (step S112). When an unwired section is present (step S112: Yes), the process returns to step S102, and the wiring-pattern generating unit 44b continues the subsequent process.

When an unwired section is not present (step S112: No), the wiring-pattern generating unit 44b displays a wiring completion message in the display unit 41 (step S113), and ends this design-information generation process.

When the wiring cannot be achieved on the surface layer (step S104: No), the wiring-pattern generating unit 44b and the design-information generating unit 44c search a wiring pattern that crosses over plural layers (step S105).

Specifically, the wiring-pattern generating unit 44b reads the constraint data 43b stored in the storing unit 43, and searches a wiring pattern that satisfies the constraints. The design-information generating unit 44c checks whether a though-hole, a via hole, and a land that are necessary for the wiring pattern searched by the wiring-pattern generating unit 44b satisfy the constraints. When a wiring pattern that satisfies the constraints is present, the wiring-pattern generating unit 44b determines that the wiring can be achieved.

The wiring-pattern generating unit 44b checks whether the wiring can be carried out by crossing over plural layers (step S106). When the wiring cannot be carried out by crossing over plural layers (step S106: No), the wiring-pattern generating unit 44b displays a wiring impossible message in the display unit 41 (step S116). The process then proceeds to step S112, and the wiring-pattern generating unit 44b continues the subsequent process at step S112.

When the wiring can be carried out by crossing over plural layers (step S106: Yes), the wiring-pattern generating unit 44b determines a combination of wiring layers (step S107), and checks whether the combination of the wiring layers includes a surface layer (step S108).

When the combination of the wiring layers does not include a surface layer (step S108: No), the wiring-pattern generating unit 44b sets a flag to "0" (step S109). The design-information generating unit 44c generates design information on shapes and sizes of an IVH and a land corresponding to the wiring pattern using one kind of information on an internal-layer land (step S110).

Thereafter, the design-information generating unit 44c displays the design information in the display unit 41, stores the information in the storing unit 43 as the design data 43c (step S111), and continues the process at step S112.

When the combination of the wiring layer includes a surface layer (step S108: Yes), the wiring-pattern generating unit 44b sets the flag to "1" (step S117).

The design-information generating unit 44c generates design information on shapes and sizes of an IVH and a land corresponding to the wiring pattern using each one kind of information on a surface-layer land and an internal-layer land, respectively (step S118), and continues the process at step S111.

Figure 8:
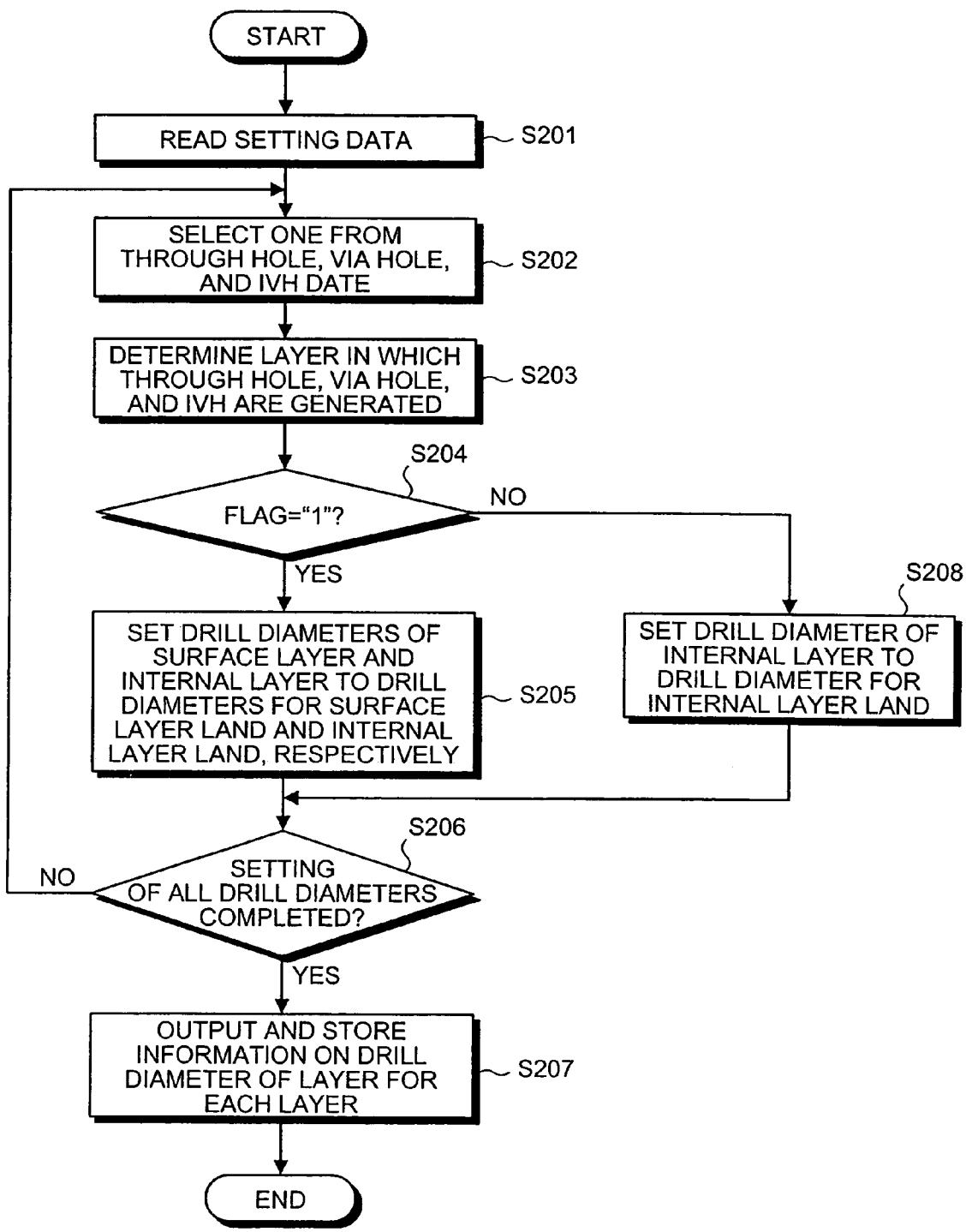
FIG. 8 is a flowchart of a processing procedure for a drill-data generation process.

FIG. 8 is a flowchart of a processing procedure for a drill-data generation process. The drill-data generation process is carried out after the design-information generation process shown in FIG. 7.

The manufacturing-information generating unit 44d of the CAD device first reads the design data 43c from the storing unit 43 (step S201). The manufacturing-information generating unit 44d selects one of the data of a through hole, a via hole, and an IVH included in the design data 43c (step S202).

The manufacturing-information generating unit 44d determines in which layer a through hole, a via hole, or an IVH that is selected is generated (step S203). The manufacturing-information generating unit 44d checks whether the value of the flag is "1" (step S204).

When the value of the flag is "1" (step S204: Yes), the manufacturing-information generating unit 44d sets a drill diameter of a surface layer and a drill diameter of an internal layer to the drill diameter of the surface-layer land and the drill diameter of the internal-layer land, respectively, explained with reference to FIG. 2 (step S205).

The manufacturing-information generating unit 44d checks whether the drill diameters of the through hole, the via hole, or the IVH generated in the design-information generation process are all set (step S206). When all the drill diameters are not set (step S206: No), the process returns to step S202, and the manufacturing-information generating unit 44d continues the subsequent process.

When all the drill diameters are set (step S206: Yes), the manufacturing-information generating unit 44d outputs the information on a drill diameter of a though-hole, a via hole, or an IVH in each layer to the output unit 42, stores this information in the storing unit 43 as the manufacturing data 43d (step S207), and ends the drill-data generation process.

When the flag is "0", not "1", at step S204 (step S204: No), the manufacturing-information generating unit 44d sets a drill diameter of an internal layer to the drill diameter of the internal-layer land explained with reference to FIG. 2 (step S208), and continues the subsequent process at step S206.

In the search process of a wiring pattern on a surface layer and the search process of a wiring pattern that crosses over plural layers in FIG. 7, it is always checked whether a wiring pattern, a through hole, a via hole, or an IVH satisfies the constraints stored in the storing unit 43 as the constraint data 43b, and whether a wiring can be carried out.

Figure 9A:
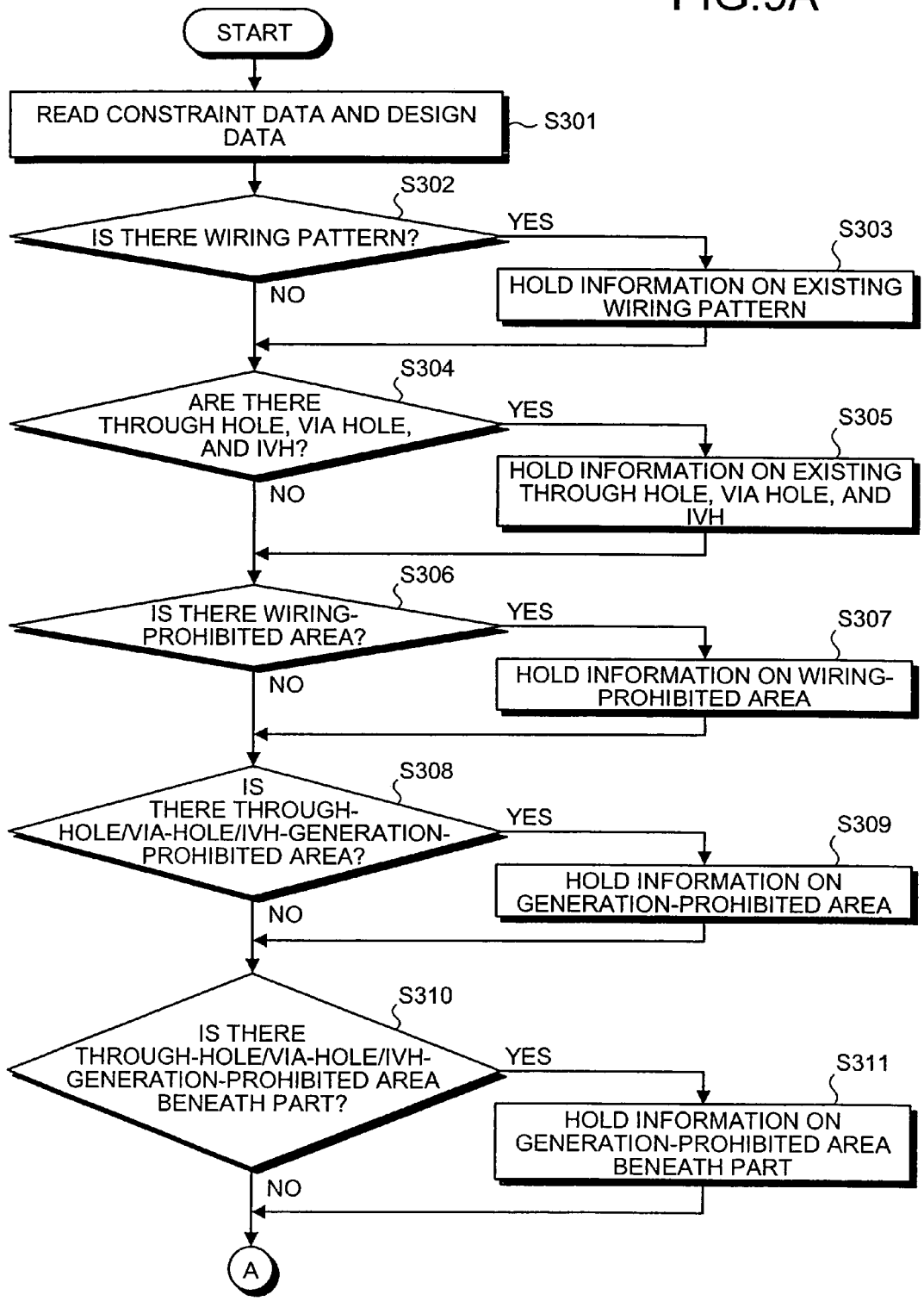

FIGS. 9A and 9B are flowcharts of a processing procedure for a wiring-possibility determination process. The wiring-pattern generating unit 44b and the design-information generating unit 44c of the CAD device first read the constraint data 43b and the design data 43c from the storing unit 43 (step S301). The wiring-pattern generating unit 44b checks whether a wiring pattern is already present on the printed wiring board (step S302).

When a wiring pattern is already present on the printed wiring board (step S302: Yes), the wiring-pattern generating unit 44b holds the information on the existing wiring pattern in a random access memory (RAM) or the like (not shown) provided in the CAD device (step S303).

When a wiring pattern is not present on the printed wiring board (step S302: No), or when the wiring-pattern generating unit 44b holds information on an existing wiring pattern (step S303), the design-information generating unit 44c checks whether a through hole, a via hole, or an IVH is already present (step S304).

When a through hole, a via hole, or an IVH is already present (step S304: Yes), the design-information generating unit 44c holds the information on a through hole, a via hole, or an IVH that is present, in the RAM or the like (step S305).

When a through hole, a via hole, or an IVH is not present (step S304: No), or when the design-information generating unit 44c already holds a through hole, a via hole, or an IVH (step S305), the wiring-pattern generating unit 44b checks whether a wiring-prohibited area is present (step S306).

When a wiring-prohibited area is present (step S306: Yes), the wiring-pattern generating unit 44b holds the information on the wiring-prohibited area in a RAM or the like (step S307). When a wiring-prohibited area is not present (step S306: No), or when the wiring-pattern generating unit 44b holds information on a wiring-prohibited area (step S307), the design-information generating unit 44c checks whether a generation prohibited area of a through hole, a via hole, and IVH is present (step S308).

When a generation prohibited area is present (step S308: Yes), the design-information generating unit 44c holds information on the generation prohibited area in a RAM or the like (step S309). When a generation prohibited area is not present (step S308; No), or when information on a generation prohibited area is held (step S309), the design-information generating unit 44c checks whether a generation prohibited area of a through hole, a via hole, and an IVH is present at a lower surface of the part.

When a generation prohibited area of a through hole, a via hole, and an IVH is present at a lower surface of the part (step S310: Yes), the design-information generating unit 44c holds information on the generation prohibited area at a lower surface of the part in a RAM or the like (step S311).

When a generation prohibited area of a through hole, a via hole, and an IVH is not present at a lower surface of the part (step S310: No), or when information on a generation prohibited area at a lower surface of the part is held (step S311), the design-information generating unit 44c checks whether a size of a surface-layer land provided on an IVH that connects a surface layer and an internal layer is larger than a size of a part land (step S312), as shown in FIG. 9B.

When the size of the surface-layer land is larger than the size of the part land (step S312: Yes), the design-information generating unit 44c sets the generation of an IVH to impossible (step S313).

When the size of the surface-layer land is not larger than the size of the part land (step S312: No), or when the design-information generating unit 44c sets the generation of an IVH to impossible (step S313), the wiring-pattern generating unit 44b checks whether a distance between wiring patterns can be set to a predetermined value or larger (step S314).

When a distance between wiring patterns cannot be set to a predetermined value or larger (step S314: No), the wiring-pattern generating unit 44b determines that a wiring cannot be carried out (step S320), and ends this wiring possibility determination process.

When a distance between wiring patterns can be set to a predetermined value or larger (step S314: Yes), the design-information generating unit 44c checks whether a distance between a through hole, a via hole, and an IVH can be set to a predetermined value or larger (step S315).

When a distance between a through hole, a via hole, and an IVH cannot be set to a predetermined value or larger (step S315: No), the process proceeds to step S320, and the design-information generating unit 44c continues the subsequent process. When a distance between a through hole, a via hole, and an IVH can be set to a predetermined value or larger (step S315: Yes), the wiring-pattern generating unit 44b checks whether a wiring can be carried out in an area other than the wiring-prohibited area (step S316).

When a wiring cannot be carried out in an area other than the wiring-prohibited area (step S316: No), the process proceeds to step S320, and the design-information generating unit 44c continues the subsequent process. When a wiring can be carried out in an area other than the wiring-prohibited area (step S316: Yes), the design-information generating unit 44c checks whether a through hole, a via hole, and an IVH can be generated in an area other than the generation prohibited area (step S317).

When a through hole, a via hole, and an IVH cannot be generated in an area other than the generation prohibited area (step S317: No), the process proceeds to step S320, and the design-information generating unit 44c continues the subsequent process.

When a through hole, a via hole, and an IVH can be generated in an area other than the generation prohibited area (step S317: Yes), the design-information generating unit 44c checks whether a through hole, a via hole, and an IVH can be generated in an area other than the generation prohibited area at a lower surface of the part (step S318).

When a through hole, a via hole, and an IVH cannot be generated in an area other than the generation prohibited area at a lower surface of the part (step S318: No), the process proceeds to step S320, and the design-information generating unit 44c continues the subsequent process.

When a through hole, a via hole, and an IVH can be generated in an area other than the generation prohibited area at a lower surface of the part (step S318: Yes), the wiring-pattern generating unit 44b determines that a wiring can be carried out, and ends the wiring possibility determination process.

Figure 10:
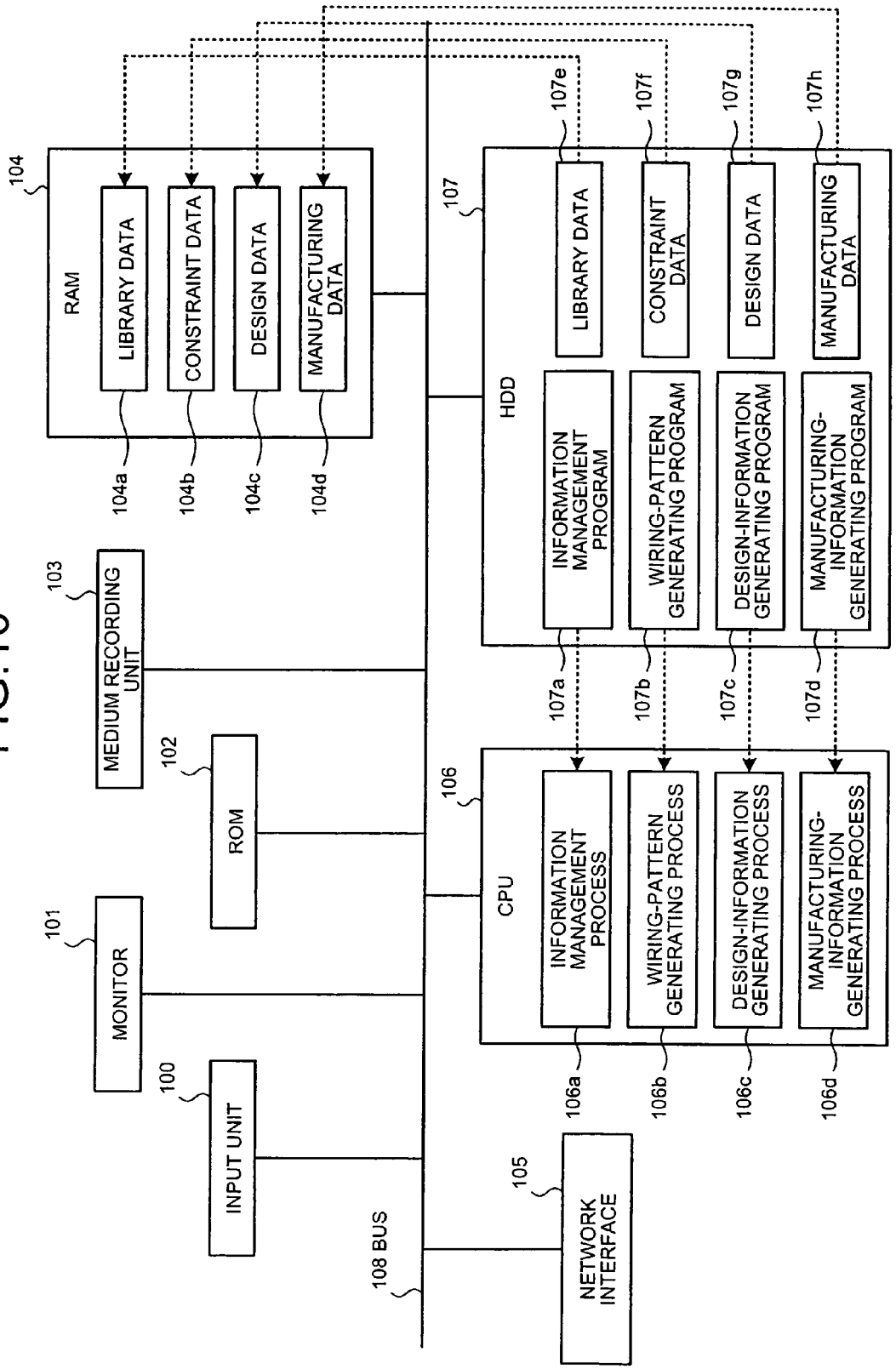
FIG. 10 is a block diagram of a hardware configuration for a computer that works as the CAD device shown in FIG. 4.
Figure 11:
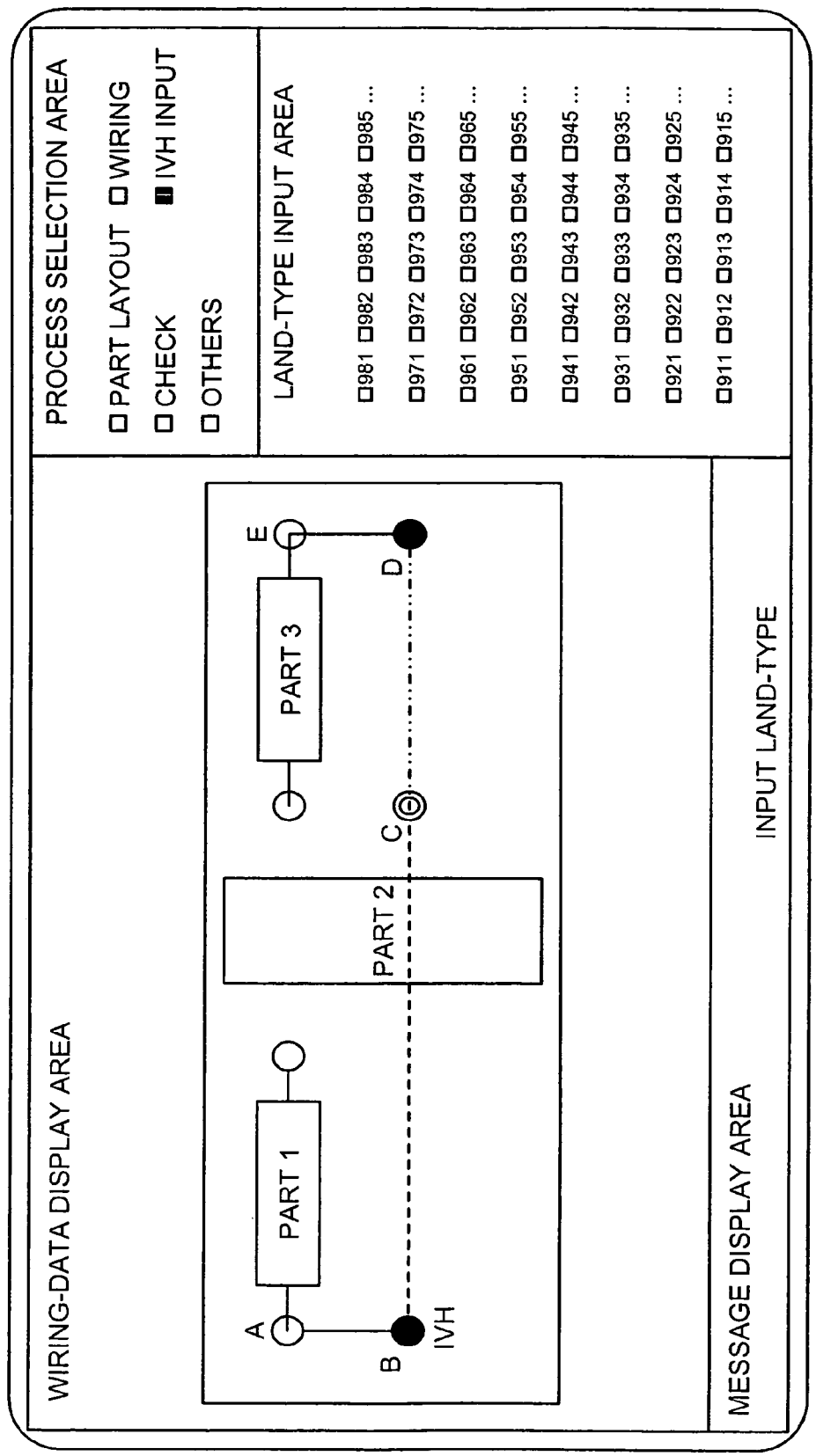
FIG. 11 is a schematic for illustrating an example of a design screen for a printed wiring board, according to a conventional technology.
Figure 12:
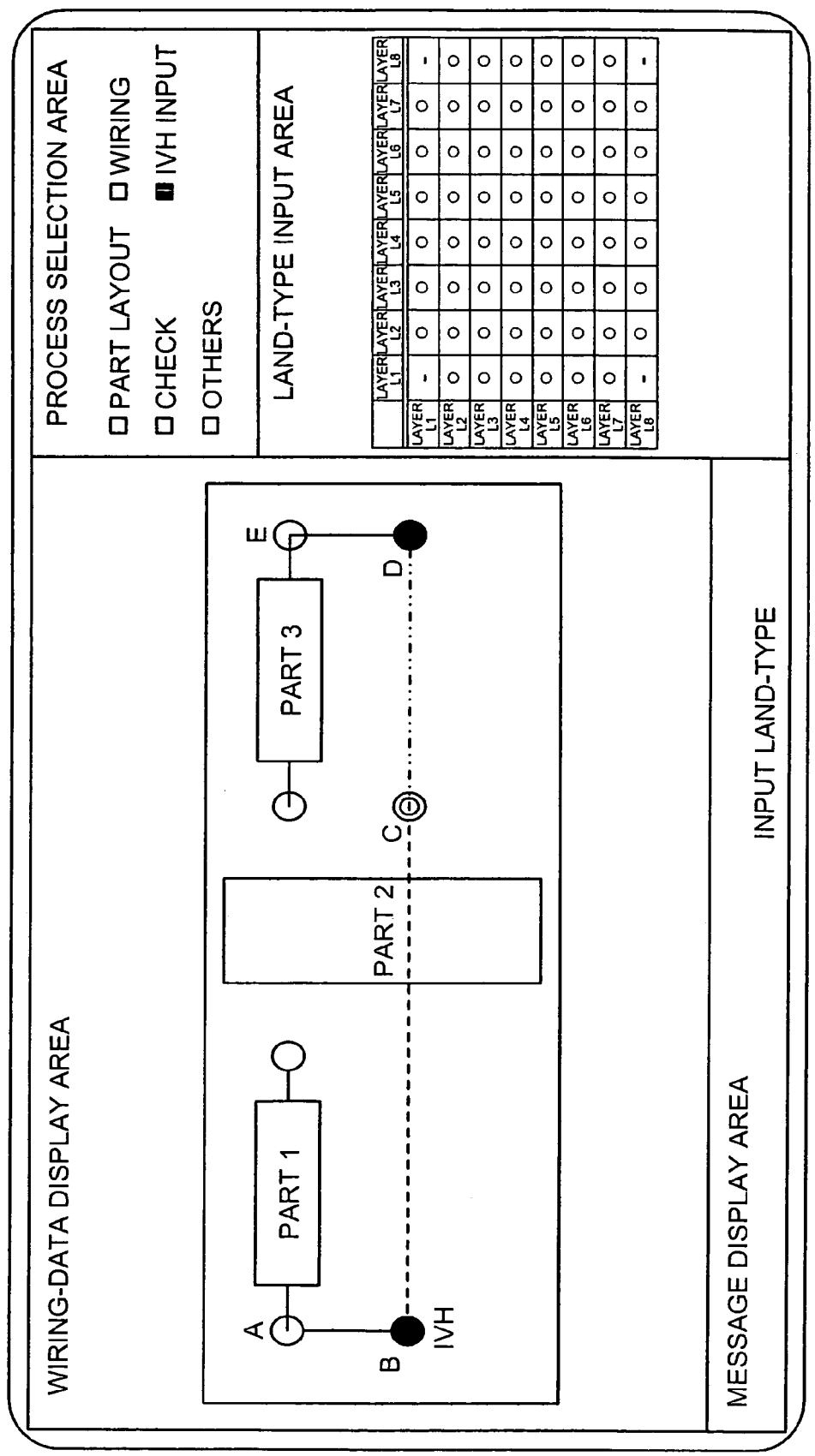
FIG. 12 is a schematic for illustrating an example of a design screen that receives inputs of a land type in a table format.

FIG. 10 is a block diagram of a hardware configuration for a computer that works as the CAD device shown in FIG. 4. The computer includes an input unit 100 that receives a data input from a user, a monitor 101, a read only memory (ROM) 102, a medium recording unit 103 that reads a program from a recording medium on which various programs are recorded, a random access memory (RAM) 104, a network interface 105 that exchanges data with other computers via a network, a central processing unit (CPU) 106, and a hard disk drive (HDD) 107. These units are connected to each other via a bus 108.

The HDD 107 is recorded with programs that exhibit functions similar to those of the CAD device shown in FIG. 4. In other words, the HDD 107 is recorded with an information-management program 107a, a wiring-pattern generating program 107b, a design-information generating program 107c, and a manufacturing-information generating program 107d. These programs can be suitably stored by integration or by scattering.

The CPU 106 reads the information-management program 107a, the wiring-pattern generating program 107b, the design-information generating program 107c, and the manufacturing-information generating program 107d from the HDD 107, and executes these programs, thereby realizing an information-management process 106a, a wiring-pattern generating process 106b, a design-information generating process 106c, and a manufacturing-information generating process 106d.

The information-management process 106a, the wiring-pattern generating process 106b, the design-information generating process 106c, and the manufacturing-information generating process 106d correspond to the information managing unit 44a, the wiring-pattern generating unit 44b, the design-information generating unit 44c, and the manufacturing-information generating unit 44d, respectively.

In addition, library data 107e, constraint data 107f, design data 107g, and manufacturing data 107h are stored in the HDD 107. The library data 107e, the constraint data 107f, the design data 107g, and the manufacturing data 107h correspond to the library data 43a, the constraint data 43b the design data 43c, and the manufacturing data 43d, respectively shown in FIG. 4.

The CPU 106 stores the library data 107e, the constraint data 107f, the design data 107g, and the manufacturing data 107h in the HDD 107. The CPU 106 reads the library data 107e, the constraint data 107f, the design data 107g, and the manufacturing data 107h from the HDD 107, and stores these data in the RAM 104. The CPU 106 executes various data processes based on the library data 104a, the constraint data 104b, the design data 104c, and the manufacturing data 104d stored in the RAM 104.

The information-management program 107a, the wiring-pattern generating program 107b, the design-information generating program 107c, and the manufacturing-information generating program 107d are not necessarily required to be stored in the HDD 107 from the beginning.

For example, these programs can be stored in a "portable recording medium" such as a flexible disk (FD), a CD-ROM, a DVD disk, a magneto-optic disk, and an integrated-circuit (IC) card that are inserted into the computer, a "fixed recording medium"such as a hard disk drive (HDD) provided at the outside of the computer, or "other computers (or servers))" connected to the computer via a public line, the Internet, a local area network (LAN), a wide area network (WAN), or the like. The computer can read the programs from these mediums or other computers, and execute the programs.

As described above, according to the present embodiment, the storing unit 43 of the CAD device stores information on any one of shapes and sizes or both of a surface-layer land and an internal-layer land that are provided around via holes. At the time of generating design information on a via hole that passes through plural internal layers of a printed wiring board, the design-information generating unit 44c applies the stored information on any one of a shape and a size or both of the internal-layer land to each internal layer through which the via hole passes, thereby generating design information. Therefore, it is possible to enable a user to easily design via holes by efficiently managing information on land without making the user aware of each layer of a wiring board through which a via holes passes.

Furthermore, according to the present embodiment, at the time of further generating design information on a via hole that passes through a surface layer and an internal layer, the design-information generating unit 44c applies the information on any one of a shape and a size or both of the surface-layer land having any one of a shape and a size or both different from those of the internal-layer land to the surface layer, thereby generating design information. Therefore, even when design conditions of a via hole on the surface layer are different from design conditions of a via hole on the internal layer, it is possible to enable the user to easily design via holes.

Moreover, according to the present embodiment, when a via hole of which design information is generated does not pass through all layers of a printed wiring board, the design-information generating unit 44c outputs via hole information indicating that the via hole is an interstitial via hole. Therefore, it is possible to enable the user to be easily aware of the interstitial via hole.

Furthermore, according to the present embodiment, the manufacturing-information generating unit 44d generates drill data of each layer of a printed wiring board for each layer based on generated design information. Therefore, drill data for each layer of the printed wiring board to be used for the manufacturing data at the time of manufacturing the printed wiring board can be easily generated.

While the embodiments of the present invention have been explained above, variously modified embodiments other than the explained ones can be made without departing from the scope of the technical spirit of the appended claims.

Of the respective process explained in the embodiments, all or a part of the process explained as being performed automatically can be performed manually, or all or a part of the process explained as being performed manually can be performed automatically in a known method.

The information including the process procedure, the control procedure, specific names, and various kinds of data and parameters shown in the specification or in the drawings can be optionally changed, unless otherwise specified.

The respective constituents of the CAD device shown in the drawings are functionally conceptual, and physically the same configuration is not always necessary. In other words, the specific mode of dispersion and integration of the CAD device is not limited to the shown one, and all or a part thereof can be functionally or physically dispersed or integrated in an optional unit, according to the various kinds of load and the status of use.

All or an optional part of the various process functions performed by the CAD device can be realized by the CPU or a program analyzed and executed by the CPU, or can be realized as hardware by the wired logic.

According to the present invention, it is possible to enable a user to easily design via holes by efficiently managing information on land without making the user aware of each layer of a wiring board through which a via holes passes.

Furthermore, according to the present invention, even when design conditions of a via hole on the surface layer are different from those of a via hole on the internal layer, it is possible to design the via holes with ease.

Moreover, according to the present invention, it is possible to enable a user to be easily aware of an interstitial via hole, and enable the user to efficiently design via holes.

Furthermore, according to the present invention, drill data for each layer of a printed wiring board to be used for the manufacturing data at the time of manufacturing the printed wiring board can be easily generated.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A computer-readable recording medium that stores therein a computer program for generating design information related to a via hole that passes through predetermined layers of a multilayer wiring board and to a plurality of lands to be formed around the via hole on the predetermined layers, wherein the computer program causes a computer to execute:

storing first information on a first shape and a first size of an internal layer land to be provided around a via hole on an internal layer and second information on a second shape and a second size of a surface layer land to be provided around a via hole on a surface layer, the second size being smaller than the first size;

generating the design information, when designing a via hole that passes through a plurality of internal layers of the wiring board and designing a plurality of lands to be formed around the via hole on the plurality of internal layers, by applying the first information to each of the internal layers through which the via hole passes; and generating the design information, when designing a via hole that passes through the surface layer and at least one internal layer of the wiring board and designing a plurality of lands to be formed around the via hole on both the surface layer and the at least one internal laver by applying the first information to each of the at least one of the internal layers through which the via hole passes and applying the second information to the surface layer through which the via hole passes.

2. The computer-readable recording medium according to claim 1, wherein the program further causes the computer to execute outputting, when the via hole for which the design information is generated does not pass through all of the layers of the wiring board, via-hole information indicating that the via hole is an interstitial via hole.

3. The computer-readable recording medium according to claim 1, wherein the program further causes the computer to execute outputting drilling information on each of the layers, based on generated design information, for each of the layers.

4. An apparatus for generating design information related to a via hole that passes through predetermined layers of a multilayer wiring board and to a plurality of lands to be formed around the via hole on the predetermined layers, the apparatus comprising:

a storing unit that stores first information on a first shape and a first size of an internal layer land to be provided around a via hole on an internal layer and second information on a second shape and second size of a surface layer to be provided around a via hole on a surface layer, the second size being smaller than the first size; and a design-information generating unit that generates the design information, when designing a via hole that passes through a pplurality of internal layers of the wiring board and designing a plurality of lands to be formed around the via hole on the plurality of internal layers, by applying the first information to each of the internal layers through which the via hole passes, and when designing a via hole that passes through the surface layer and at least one internal layer of the wiring board and designing a plurality of lands to be formed around the via hole on both the surface layer and the at least one internal lavers, by applying the first information to each of the at least one of the internal avers through which the via hole passes and applying the second information to the surface layer through which the via hole passes.

5. The apparatus according to claim 4, further comprising:

a via-hole-information output unit that outputs, when the via hole for which the design information is generated does not pass through all of the layers of the wiring board, via-hole information indicating that the via hole is an interstitial via hole.

6. The apparatus according to claim 4, further comprising:

a drilling-information output unit that outputs drilling information on each of the layers, based on generated design information, for each of the layers.

7. A method of generating design information related to a via hole that passes through predetermined layers of a multilayer wiring board and to a plurality of lands to be formed around the via hole on the predetermined layers, the method comprising:

storing first information on a first shape and a first size of an internal layer land to be provided around a via hole on an internal layer and second information on a second shape and a second size of a surface layer land to be provided around a via hole on a surface layer, the second size being smaller than the first size;

generating the design information, when designing a via hole that passes through a plurality of internal layers of the wiring board and designing a plurality of lands to be formed around the via hole on the plurality of internal layers, by applying the first information to each of the internal layers through which the via hole passes; and generating the design information, when designing a via hole that passes through the surface layer and at least one internal layer of the wiring board and designing a plurality of lands to be formed around the via hole on both the surface layer and the at least one internal layer by applying the first information to each of the at least one of the internal avers through which the via hole passes and applying the second information to the surface layer through which the via hole passes.

8. The method according to claim 7, further comprising:

outputting, when the via hole for which the design information is generated does not pass through all of the layers of the wiring board, via hole information indicating that the via hole is an interstitial via hole.

9. The method according to claim 7, further comprising:

outputting drilling information on each of the layers, based on generated design information, for each of the layers.

\* \* \* \* \*

UNITED STATES PATENT AND TRADEMARK OFFICE
CERTIFICATE OF CORRECTION

| | |
|---|---|
| PATENT NO. | : 7,441,221 B2 |
| APPLICATION NO. | : 11/251770 |
| DATED | : October 21, 2008 |
| INVENTOR(S) | : Taketsugu Kawamichi et al. |

It is certified that error appears in the above-identified patent and that said Letters Patent is hereby corrected as shown below:

Title Page, Column 2 (Other Publications), Line 1, change ""Prinited" to --"Printed--.

Column 15, Line 14, change "laver" to --layer--.

Column 15, Lines 42-43, change "pplurality" to --plurality--.

Column 16, Line 1, change "lavers," to --layers,--.

Column 16, Line 2, change "avers" to --layers--.

Column 16, Line 39, change "avers" to --layers--.

Column 16, Line 45, change "via hole" to --via-hole--.

Signed and Sealed this

Thirtieth Day of December, 2008

JON W. DUDAS
*Director of the United States Patent and Trademark Office*